United States Patent [19]
Ishii

[11] Patent Number: 5,223,752
[45] Date of Patent: Jun. 29, 1993

[54] LEVEL CONVERSION CIRCUIT FOR CONVERTING ECL-LEVEL SIGNALS INTO MOS-LEVEL SIGNALS AND ADDRESS SIGNAL DECODING SYSTEM HAVING THE LEVEL CONVERSION CIRCUIT

[75] Inventor: Yasuhiro Ishii, Kawasaki, Japan

[73] Assignee: Fujitsu Limited, Kawasaki, Japan

[21] Appl. No.: 854,533

[22] Filed: Mar. 19, 1992

[30] Foreign Application Priority Data

Mar. 19, 1991 [JP] Japan .................................. 3-55039

[51] Int. Cl.⁵ .......................................... H03K 19/094
[52] U.S. Cl. .................................. 307/475; 307/446; 307/449; 307/473
[58] Field of Search ............... 307/443, 446, 449, 463, 307/473, 475

[56] References Cited

U.S. PATENT DOCUMENTS

| | | | |
|---|---|---|---|
| 4,697,109 | 9/1987 | Honma et al. | 307/475 |
| 4,798,977 | 1/1989 | Sakui et al. | 307/449 X |
| 5,017,812 | 5/1991 | Wu | 307/475 |
| 5,019,727 | 5/1991 | Kusaka | 307/449 |
| 5,157,283 | 10/1992 | Kin | 307/463 X |

FOREIGN PATENT DOCUMENTS 0314455  5/1989  European Pat. Off. .
0328110  8/1989  European Pat. Off. .
0170286  3/1990  European Pat. Off. .
272119  11/1988  Japan .

Primary Examiner—David R. Hudspeth
Attorney, Agent, or Firm—Staas & Halsey

[57] ABSTRACT

A level conversion circuit includes first to nth circuits, each having an input terminal and first to nth output terminals where n is an integer, and first to nth signal lines coupled to the first to nth circuits. Each of the first to nth circuits comprises a part for outputting a first voltage to the first output terminal and outputting a second voltage to the second to nth output terminals other than the first output terminal when an input signal applied to the input terminal is at a first level and for maintaining the first to nth output terminals in high-impedance states when the input signal is at a second level different from the first level. The first output terminal of each of the first to nth circuits is connected to one of the first to nth signal lines so that first output terminals of the first to nth circuits are connected to mutually different signal lines. The second to nth output terminals of each of the first to nth circuits are connected to (n−1) signal lines other than the one of the first to nth signal lines to which the first output terminal is connected.

14 Claims, 10 Drawing Sheets

LEVEL CONVERSION CIRCUIT FOR CONVERTING ECL-LEVEL SIGNALS INTO MOS-LEVEL SIGNALS AND ADDRESS SIGNAL DECODING SYSTEM HAVING THE LEVEL CONVERSION CIRCUIT

BACKGROUND OF THE INVENTION (1) Field of the Invention

The present invention generally relates to level conversion circuits and more particularly to a level conversion circuit for converting ECL-level signals into MOS-level signals. Further, the present invention is concerned with an address signal decoding system of a memory device using such a level conversion circuit.

(2) Description of the Prior Art

FIG.1 is a block diagram of a RAM device comprised of Bi-CMOS (Bipolar-Complementary Metal Oxide Semiconductor) transistors. The RAM device shown in FIG.1 comprises a chip main body 1, address signal input terminals $2_1$ and $2_2$ respectively receiving ECL-level signals A1 and A2, an input buffer circuit 3, a level conversion circuit 4, an address decoder 5, a memory cell array 6, a sense amplifier 7 and an output terminal 8. The input buffer circuit 3 derives pairs of ECL-level complementary signals A1 and /A1 and A2 and /A2. It will be noted that A1 and A2 shown in FIG.1 are written as "/A1" and "/A2" in the specification for convenience.

The level conversion circuit 4 converts the ECL-level signals A1, /A1, A2 and /A2 into MOS-level signals a1, /a1, a2 and /a2, respectively. The address decoder 5 derives decode signals b1, b2, b3 and b4 from the MOS-level signals a1, /a1, a2 and /a2. The decode signals b1, b2, b3 and b4 are applied to the memory cell array 6, and data is written into or read out from a specified memory cell. The readout data is sensed by the sense amplifier 7 and output to the output terminal 8.

FIG.2 is a circuit diagram of the input buffer circuit 3 and the level conversion circuit 4. The input buffer circuit 3 is composed of two input buffer circuits $9_1$ and $9_2$/ The input buffer circuit 3 comprises power supply lines $10_1$ and $10_2$ set to a ground voltage of zero volt, power supply lines $11_1$ and $11_2$ set to $-5.2$ V, load resistors $12_1$, $12_2$, $13_1$ and $13_2$, npn transistors $14_1$, $14_2$, $15_1$ and $15_2$, constant-current sources $16_1$ and $16_2$, and reference voltage input terminals $17_1$ and $17_2$ to which identical reference voltages $V_R$ are respectively applied.

The level conversion circuit 4 is composed of two level conversion circuits $18_1$ and $18_2$, power supply lines $19_1$ and $19_2$ set to zero volt, power supply lines $20_1$ and $20_2$ set to $-5$ V, pMOS transistors $21_1$, $21_2$, $22_1$ and $22_2$, nMOS transistors $23_1$, $23_2$, $24_1$ and $24_2$, and output terminals $25_1$, $25_2$, $26_1$ and $26_2$.

When the address signal A1 applied to the input buffer circuit 91 is maintained at a low (L) level, the NPN transistors $14_1$ and $15_1$ are turned OFF and ON, respectively. Then, the levels of nodes 27 and 28 are switched to a high (H) level ($=0$ V) and a low (L) level ($=-1.6$ V). Hence, the pMOS transistors $21_1$ and $22_1$ of the level conversion circuit $18_1$ are turned ON and OFF, respectively, and the nMOS transistors $23_1$ and $24_1$ are turned OFF and ON, respectively. Thus, the levels of the output terminals $25_1$ and $26_1$ switch to a high (H) level ($=0$ V) and a low level ($=-5$ V), respectively.

When the address signal A1 is at H, the NPN transistors $14_1$ and $15_1$ are turned ON and OFF, respectively, and the levels of the nodes 27 and 28 are switched to $L(=-1.6$ V) and $H(=0$ V), respectively. Hence, the pMOS transistors $21_1$ and $22_1$ of the level conversion circuit 181 are turned OFF and ON, and the nMOS transistors $23_1$ and $24_1$ are turned ON and OFF, respectively. As a result, the levels of the output terminals $25_1$ and $26_1$ are switched to L ($=-5$ V) and H($=0$ V), respectively. The input buffer circuit $9_2$ and the level conversion circuit $18_2$ operate in the same manner as describe above.

In some cases, emitter follower circuits are inserted between the input buffer circuit 3 and the level conversion circuit 4. In this configuration, the high level of each address signal is equal to $-0.8$ V.

However, the conventional RAMs having Bi-MOS circuits as described above have the following disadvantages. As shown in FIG.3, a wired-OR circuit (composed of bipolar transistors) 29 is connected to the output terminals of the input buffer circuit 3 in order to increase the operation speed of the RAM. The wired-OR circuit 29 decodes the address signals A1 and A2 and generates ECL-level decode signals B1–B4, which are converted into the MOS-level decode signals b1-b4 by a level conversion circuit 30. However, the level conversion circuit 30 cannot be formed with the conventional level conversion circuit 4 shown in FIG.1, because the level conversion circuit 4 needs complementary input signals.

SUMMARY OF THE INVENTION

It is a general object of the present invention to provide an improved level conversion circuit in which the above disadvantage is eliminated.

A more specific object of the present invention is to provide a level conversion circuit capable of converting ECL-level signals output by a wired-OR circuit into MOS-level signals.

The above objects of the present invention are achieved by a level conversion circuit including first to nth circuits, each having an input terminal and first to nth output terminals where n is an integer, and first to nth signal lines coupled to the first to nth circuits. Each of the first to nth circuit comprises a part for outputting a first voltage to the first output terminal and outputting a second voltage to the second to nth output terminals other than the first output terminal when an input signal applied to the input terminal is at a first level and for maintaining the first to nth output terminals in high-impedance states when the input signal is at a second level different from the first level. The first output terminal of each of the first to nth circuits is connected to one of the first to nth signal lines so that first output terminals of the first to nth circuits are connected to mutually different signal lines. The second to nth output terminals of each of the first to nth circuits are connected to (n−1) signal lines other than the one of the first to nth signal lines to which the first output terminal is connected.

Another object of the present invention is to provide an address signal decoding system of a memory device using the above-mentioned level conversion circuit.

This object of the present invention is achieved by an address signal decoding system for supplying n address signals to a memory cell array of a memory device, the address signal decoding system comprising: input buffer means for generating $\log_2 n$ pairs of complementary signals from $\log_2 n$ external address signals where n is an integer; wired-OR circuit means, coupled to the input buffer means, for generating n address signals from the $\log_2 n$ pairs of complementary signals; and level conversion circuit means, coupled to the wired-OR circuit means, for generating n level-converted address signals from the n address signals and for supplying the n level-converted address signals to the memory cell array. The level conversion circuit means is configured as described above.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 4:
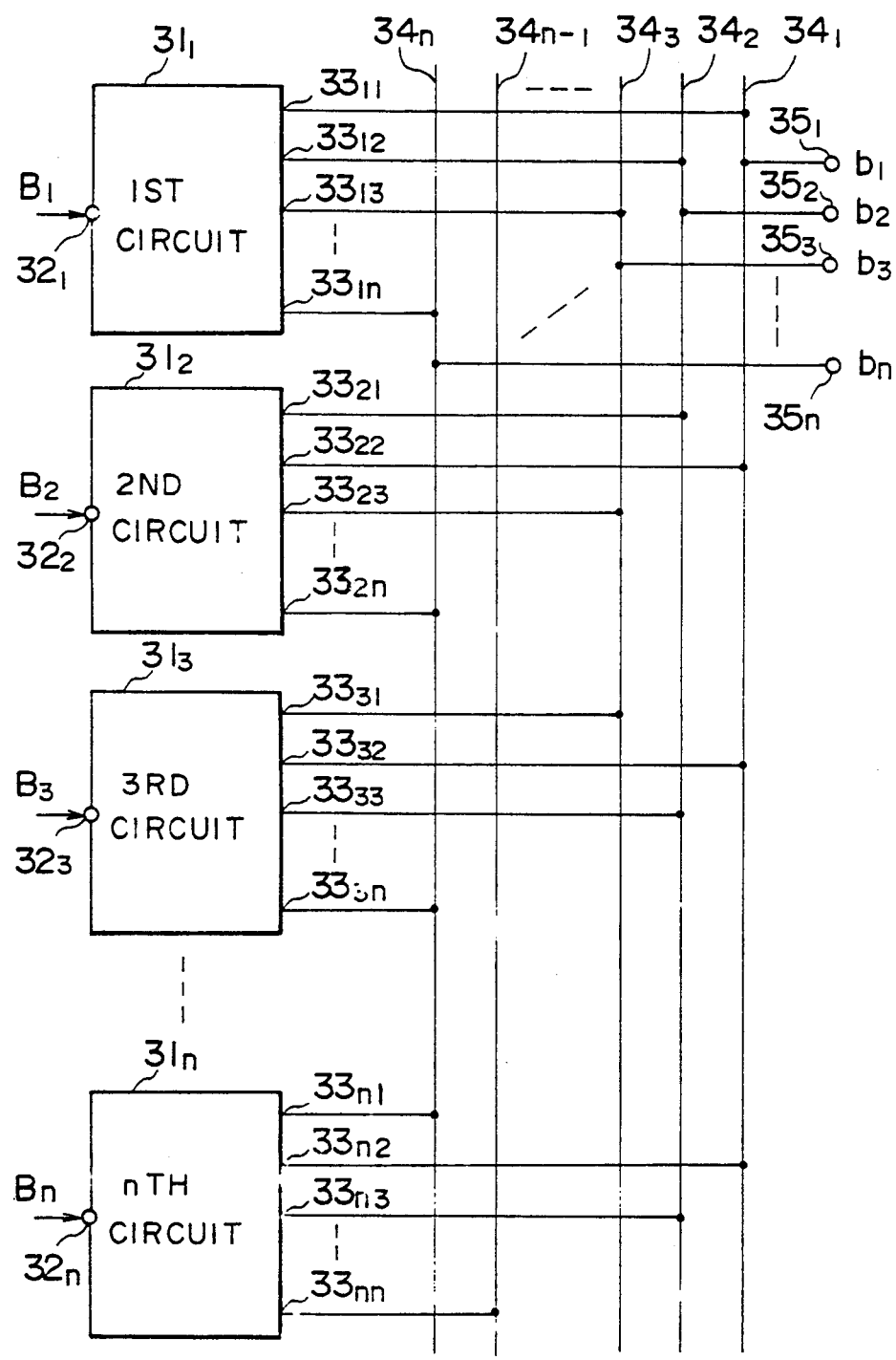
FIG.4 is a block diagram showing an outline of a level conversion circuit according to a first embodiment of the present invention.

FIG.4 shows a level conversion circuit of a first embodiment of the present invention. The level conversion circuit shown in FIG.4 comprises n (n is an integer) circuits $31_1-31_n$, which have input terminals $32_1-32_n$, respectively. Input signals $B_1-B_n$ are applied to the input terminals $32_1-32_n$. Each of the circuits $31_1-31_n$ has n output terminals. For example, the first circuit $31_1$ has n output terminals $33_{11}-33_{1n}$, and the nth circuit $31_n$ has n output terminals $33_{n1}-33_{nn}$. The n output terminals of each of the circuits $31_1-31_n$ are connected to signal lines $34_1-34_n$. Level-converted signal output terminals $35_1-35_n$ are connected to the signal lines $34_1-34_n$, respectively. The output signals $b_1-b_n$ of the present level conversion circuit are output via the level-converted signal output terminals $35_1-35_n$.

When the input signals $B_1-B_n$ are maintained at first identical levels, the first to nth circuits $31_1-31_n$ output first identical voltages to the first output terminals $33_{11}$, $33_{21}$, ..., $33_{n1}$, and output second identical voltages different from the first identical voltages to the second to nth output terminals $33_{12}-33_{1n}$, $33_{22}-33_{2n}$, ..., $33_{n2}-33_{nn}$. When the input signals $B_{-Bn}$ are maintained at second identical levels different from the first identical levels, the first to nth circuits $31_1-31_n$ maintain the first to nth output terminals $33_{11}-33_{1n}$, $33_{21}-33_{2n}$, ..., $33_{n1}-33_{nn}$ in a high impedance state.

The first output terminals $33_{11}$, $33_{21}$, $33_{31}$, ..., $33_{n1}$ of the first to nth circuits $31_1-31_n$ are respectively connected to the level-converted signal output terminals $35_1-35_n$. The second to nth output terminals of each of the first to nth circuits $31_1-31_n$ are respectively connected to n−1 level-converted signal output terminals other than the level-converted signal output terminal to which the first output terminal thereof. For example, the second to nth output terminals $33_{12}$ to $33_{1n}$ of the first circuit $31_1$ are connected to the level-converted signal output terminals $35_2-35_n$, respectively. In the second circuit $31_2$, the second output terminal $33_{21}$ thereof is connected to the first level-converted signal output terminal $35_1$, and the third to nth output terminals $33_{23}-33_{2n}$ thereof are connected to the third to nth level-converted signal output terminals $35_3-35_n$, respectively.

During the operation of the level conversion circuit shown in FIG.4, only when one of the input signals B1-Bn is maintained at the first level, and the other (n−1) input signals are maintained at the identical second levels, the level conversion circuit executes the correct level converting operation on the input signals B1-Bn. In other words, if two or more input signals are at the identical first levels, the level conversion circuits does not correctly convert the levels of the input signals B1-Bn.

Figure 5:
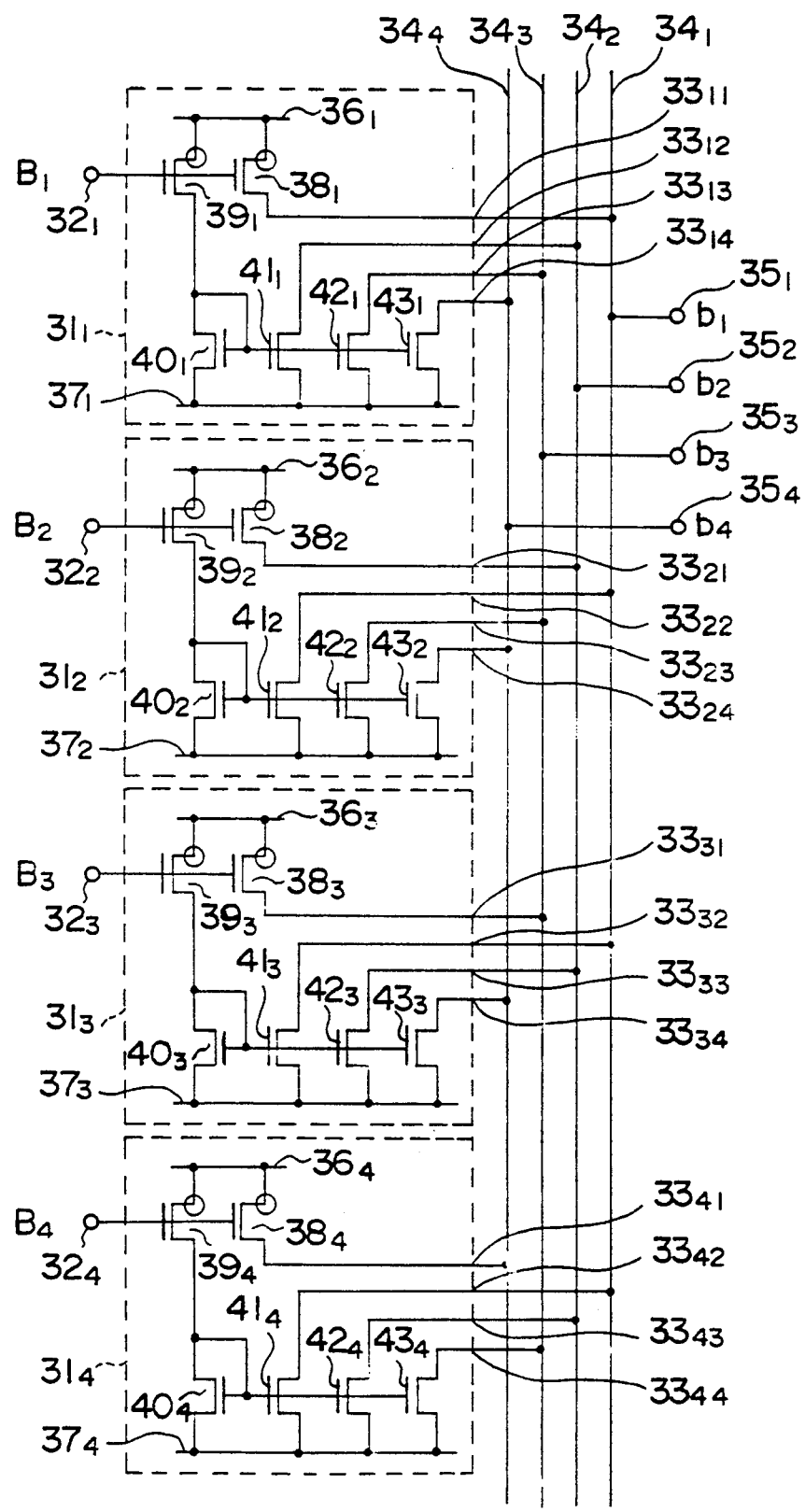
FIG.5 is a circuit diagram of the level conversion circuit according to the first embodiment of the present invention.

FIG.5 is a circuit diagram of the first embodiment of the present invention. The level conversion circuit shown in FIG.5 has four circuits $31_1-31_4$ (n=4), and converts the ECL-level signals B1-B4 into the MOS-level signals b1-b4. The circuits $31_1-31_4$ have identical structures. More specifically, the circuit $31_1$ comprises a power supply line $36_1$ set to zero volt, a power supply line $37_1$ set to, for example, −5 V, pMOS transistors $38_1$ and $39_1$, and nMOS transistors $40_1-43_1$. The circuit $31_2$ comprises a power supply line $36_2$ set to zero volt, a power supply line $37_2$ set to, for example, −5 V, pMOS transistors $38_2$ and $39_2$, and nMOS transistors $40_2-43_2$. The circuit $31_3$ comprises a power supply line $36_3$ set to zero volt, a power supply line $37_3$ set to, for example, −5 V, pMOS transistors $38_3$ and $39_3$, and nMOS transistors $40_3-43_3$. The circuit $31_4$ comprises a power supply line $36_4$ set to zero volt, a power supply line $37_4$ set to, for example, −5 V, pMOS transistors $38_4$ and $39_4$, and nMOS transistors $40_4-43_4$. When each circuit receives n input signals, it has n nMOS transistors while two pMOS transistors are used irrespective of the number of input signals.

In the first circuit $31_1$, the pMOS transistor $38_1$ has a gate connected to the input terminal $32_1$, a source connected to the power supply line $36_1$, and a drain connected to the first output terminal $33_1$. The pMOS transistor $39_1$ has a gate connected to the input terminal $32_1$, a source connected to the power supply line $36_1$, and a drain connected to the gate and drain of the nMOS transistor $40_1$. The source of the nMOS transistor $40_1$ is connected to the power supply line $37_1$.

The nMOS transistor $43_1$ has a gate connected to the gate of the nMOS transistor $40_1$, a drain connected to the second output terminal $33_{12}$, and a source connected to the power supply line $37_1$. The MOS transistor $42_1$ has a gate connected to the gate of the nMOS transistor $40_1$, a drain connected to the third output terminal $33_{13}$, and a source connected to the power supply line $37_1$. The nMOS transistor $43_1$ has a gate connected to the gate of the nMOS transistor $40_1$, a drain connected to the fourth output terminal $33_{14}$, and a source connected to the power supply line $37_1$.

In the second circuit $31_2$, the pMOS transistor $38_2$ has a gate connected to the input terminal $32_2$, a source connected to the power supply line $36_2$, and a drain connected to the first output terminal $33_{21}$. The pMOS transistor $39_2$ has gate connected to the input terminal $32_2$, a source connected to the power supply line $36_2$, and a drain connected to the gate and drain of the nMOS transistor $40_2$. The source of the nMOS transistor $40_2$ is connected to the power supply line $37_2$.

The nMOS transistor $41_2$ has a gate connected to the gate of the nMOS transistor $40_2$, a drain connected to the second output terminal $33_{22}$, and a source connected to the power supply line $37_2$. The nMOS transistor $42_2$ has a gate connected to the gate of the nMOS transistor $40_2$, a drain connected to the third output terminal $33_{23}$, and a source connected to the power supply line $37_2$. The nMOS transistor $43_2$ has a gate connected to the gate of the nMOS transistor $40_2$, a drain connected to the fourth output terminal $33_{24}$, and a source connected to the power supply line $37_2$.

In the third circuit $33_3$, the pMOS transistor $38_3$ has a gate connected to the input terminal $32_3$, a source connected to the power supply line $36_3$, and a drain connected to the first output terminal $33_{31}$. The pMOS transistor $39_3$ has a gate connected to the input terminal $32_3$, a source connected to the power supply line $36_3$, and a drain connected to the gate and drain of the nMOS transistor $40_3$. The source of the nMOS transistor $40_3$ is connected to the power supply line $37_3$.

The nMOS transistor $41_3$ has a gate connected to the gate of the nMOS transistor $40_3$, a drain connected to the second output terminal $33_{32}$, and a source connected to the power supply line $37_3$. The nMOS transistor $42_3$ has a gate connected to the gate of the nMOS transistor $40_3$, a drain connected to the third output terminal $33_{33}$, and a source connected to the power supply line $37_3$. The nMOS transistor $43_3$ has a gate connected to the gate of the nMOS transistor nMOS $40_3$, a drain connected to the fourth output terminal $33_{34}$, and a source connected to the power supply line $37_3$.

In the fourth circuit $31_4$, the pMOS transistor $38_4$ has a gate connected to the input terminal $32_4$, a source connected to the power supply line $36_4$, and a drain connected to the first output terminal $33_{41}$. The pMOS transistor $39_4$ has a gate connected to the input terminal $32_4$, a source connected to the power supply line $36_4$, and a drain connected to the gate and drain of the nMOS transistor $40_4$. The source of the nMOS transistor $40_4$ is connected to the power supply line $37_4$.

The nMOS transistor $41_4$ has a gate connected to the gate of the nMOS transistor $40_4$, a drain connected to the second output terminal $33_{42}$, and a source connected to the power supply line $37_4$. The nMOS transistor $42_4$ has a gate connected to the gate of the nMOS transistor $40_4$, a drain connected to the third output terminal $33_{43}$, and a source connected to the power supply line $37_4$. The nMOS transistor $43_4$ has a gate connected to the gate of the nMOS transistor $40_4$, a drain connected to the fourth output terminal $33_{44}$, and a source connected to the power supply line $37_4$.

The pMOS transistors $38_1$–$38_4$ and $39_1$–$39_4$ are OFF when the input signals $B_1$–$B_4$ are at H (= −0.8 V), and ON when the signals $B_1$–$B_4$ are at L (= −1.6 V). The nMOS transistors $40_1$–$40_4$ are ON when the pMOS transistors $39_1$–$39_4$ are ON, and OFF when the pMOS transistors $39_1$–$39_4$ are OFF. The nMOS transistors $41_1$–$41_4$, $42_1$–$42_4$ and $43_1$–$43_4$ have the same characteristics as those of the nMOS transistors $40_1$–$40_4$.

In the first circuit $31_1$, the first output terminal $33_{11}$ is coupled to the level-converted signal output terminal $35_1$ via the signal line $34_1$. The second output terminal $33_{12}$ is coupled to the level-converted signal output terminal $35_2$ via the signal line $34_2$. The third output terminal $33_{13}$ is coupled to the level-converted output terminal $35_3$ via the line $34_1$. The fourth output terminal $33_{14}$ is coupled to the level-converted signal output terminal $35_4$ via the signal line $34_4$.

In the second circuit $3_{12}$, the first output terminal $33_{21}$ is coupled to the level-converted signal output terminal $35_2$ via the signal line $34_2$. The second output terminal $33_{22}$ is coupled to the level-converted signal output terminal $35_1$ via the signal line $34_1$. The third output terminal $33_{23}$ is coupled to the level-converted signal output terminal $35_3$ via the signal line $34_3$. The fourth output terminal $33_{24}$ is coupled to the level-converted signal output terminal $35_4$ via the signal line $34_4$.

In the third circuit $31_3$, the first output terminal $33_{31}$ is coupled to the level-converted signal output terminal $35_3$ via the signal line $34_3$. The second output terminal $33_{32}$ is coupled to the level-converted signal output terminal $35_1$ via the signal line $34_1$. The third output terminal $33_{33}$ is coupled to the level-converted signal output terminal $35_2$ via the signal line $24_2$. The fourth output terminal $33_{34}$ is coupled to the level-converted signal output terminal $35_4$ via the signal line $34_4$.

In the fourth circuit $31_4$, the first output terminal $33_{41}$ is coupled to the level-converted signal output terminal $35_4$ via the signal line $34_4$. The second output terminal $33_{42}$ is coupled to the level-converted signal output terminal $35_1$ via the signal line $34_1$. The third output terminal $33_{43}$ is coupled to the level-converted signal output terminal via the signal line $34_2$. The fourth output terminal $33_{44}$ is coupled to the level-converted signal output terminal $35_3$ via the signal line $34_3$.

The level conversion circuit shown in FIG.5 operates as shown in Table 1.

TABLE 1

| B1 | B2 | B3 | B4 | b1 | b2 | b3 | b4 |
|---|---|---|---|---|---|---|---|
| L | H | H | H | H | L | L | L |
| H | L | H | H | L | H | L | L |
| H | H | L | H | L | L | H | L |
| H | H | H | L | L | L | L | H |
| | H = −0.8 V | | | | H = 0 V | | |
| | L = −1.6 V | | | | L = 5 V | | |

Figure 6:
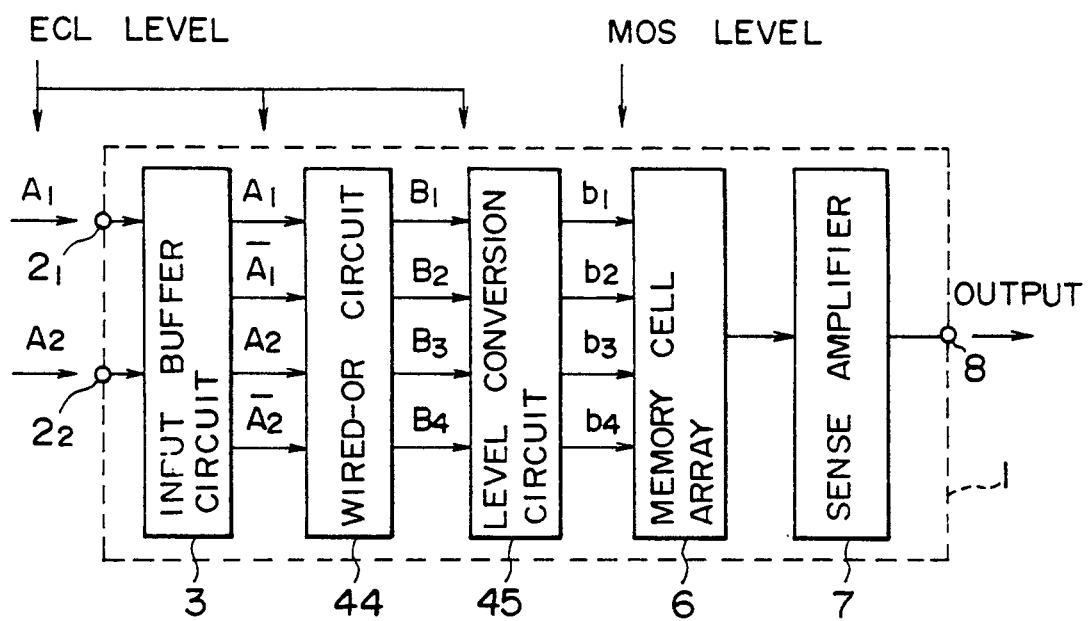
FIG.6 is a block diagram of a first application of the first embodiment of the present invention.

FIG.6 shows a first application of the first embodiment of the present invention. The first application shown in FIG.6 comprises the level conversion circuit according to the first embodiment of the present invention applied to a RAM including Bi-CMOS transistors. The RAM shown in FIG.6 comprises a wired-OR circuit 44, and a level conversion circuit 45 according to the first embodiment of the present invention. It will be noted that n address signals applied to the memory cell array 6 are derived from $\log_2 n$ external address signals.

Figure 7:
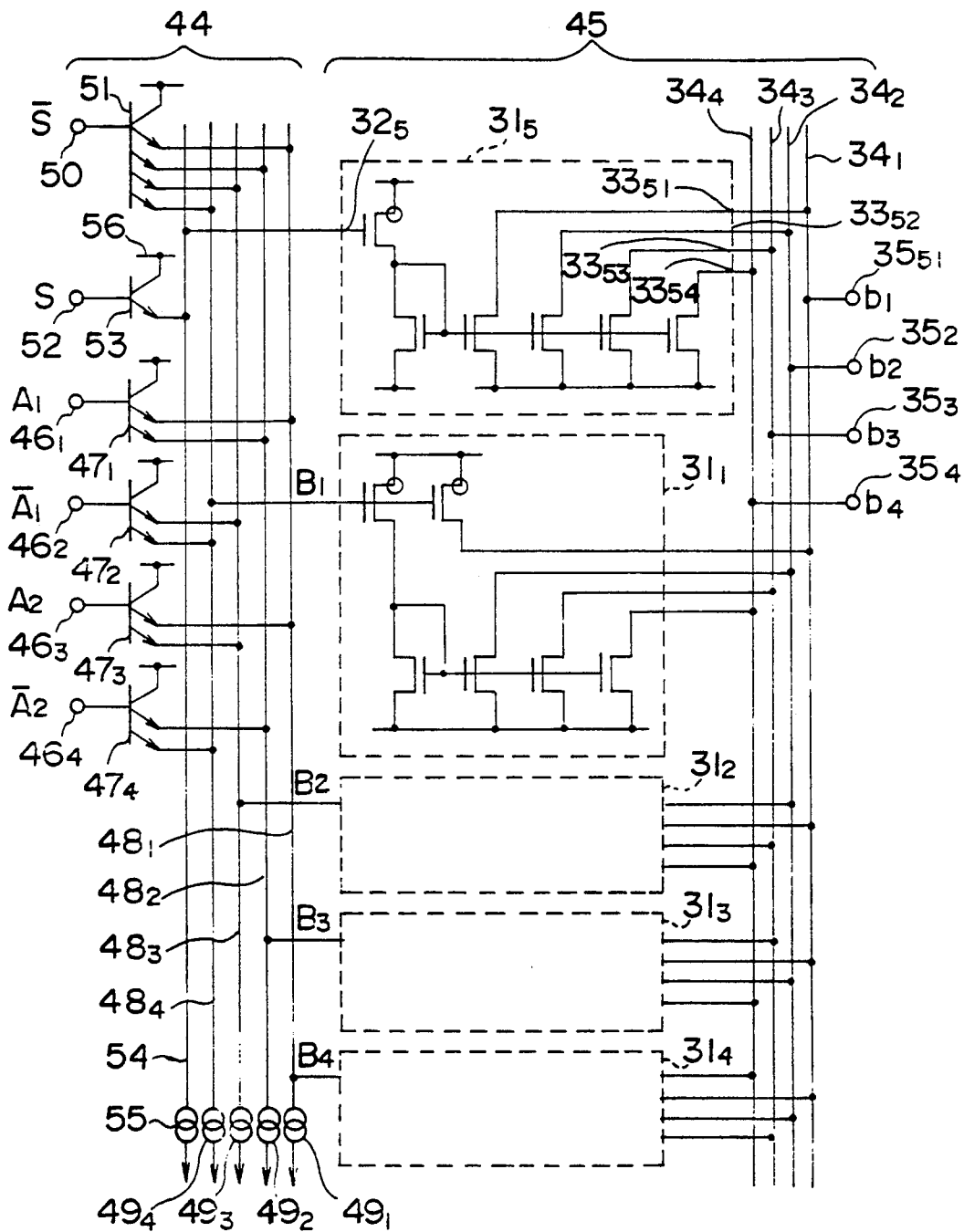
FIG.7 is a block diagram of a second application of the first embodiment of the present invention.

The wired-OR circuit 44 is configured as shown in FIG.7. The wired-OR circuit 44 comprises input terminals $46_1$–$46_4$ to which the input signals A1, /A1, A2 and /A2 are applied respectively, multi-emitter type NPN transistors $47_1$–$47_4$, each having two emitters. Further, the wired-OR circuit 44 comprises constant-current sources $49_1$–$49_4$, a select signal input terminal 50 to which a select signal /S for selecting the wired-OR circuit 44, and a multi-emitter type NPN transistor 51 having four emitters. The select signal /S is set to the L level when the wired-OR circuit 44 is selected, and set to the H level when it is not selected.

The relationship among the ECL-level complementary signals A1, /A1, A2 and /A2, the ECL-level decoded signals B1, B2, B3 and B4, and the MOS-level decoded signals b1, b2, b3 and b4 are as shown in Table 2.

TABLE 2

| A1 | /A1 | A2 | /A2 | B1 | B2 | B3 | B4 | b1 | b2 | b3 | b4 |
|----|-----|----|----|----|----|----|----|----|----|----|----|
| H | L | H | L | L | H | H | H | H | L | L | L |
| H | L | L | H | H | L | H | H | L | H | L | L |
| L | H | H | L | H | H | L | H | L | L | H | L |
| L | H | L | H | H | H | H | L | L | L | L | H |

H = −0.8 V   H = 0 V
L = −1.6 V   L = −5 V

Figure 8:
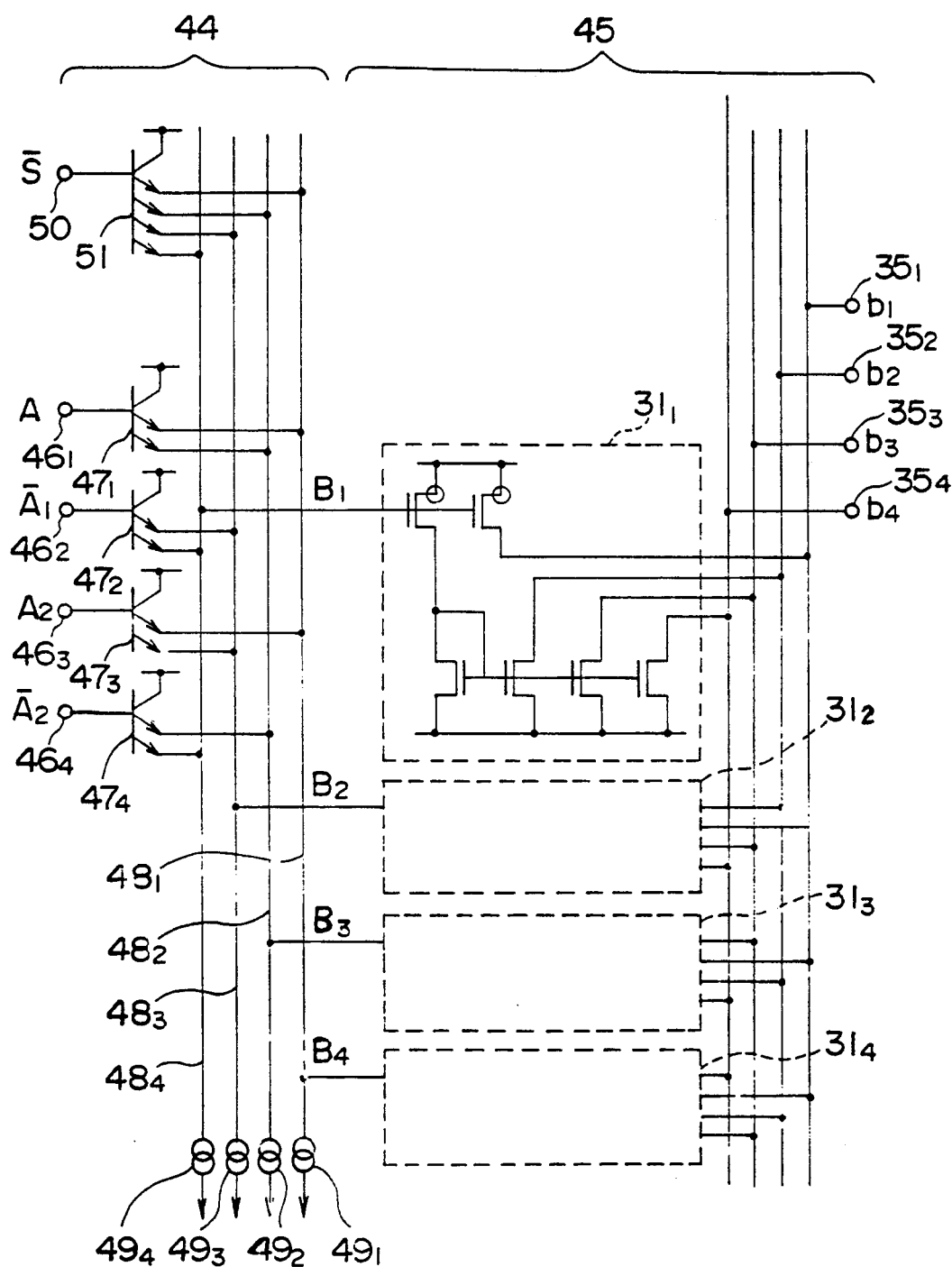
FIG.8 is a circuit diagram of a wired-OR circuit shown in FIG.6.

FIG.8 shows a second application of the first embodiment of the present invention. The second application corresponds to an improvement in the first application. In the first application, when the wired-OR circuit is not selected, the select signal /S is set to L. In this case, the decoded input signals B1-B4 are at H, and hence the level-converted signal output terminals $35_1$–$35_4$ are in the floating states. The second application is intended to eliminate the above problem. The second application shown in FIG.8 comprises an inverted select signal input terminal 52 to which an inverted version S of the select signal /S is applied, an NPN transistor 53, a signal line 54, a constant-current source 55, and a fifth circuit $31_5$ having the same structure as that of each of the first to fourth (n=4) circuits $31_1$–$31_4$.

The NPN transistor 53 has a base connected to the inverted select signal input terminal 52, a collector connected to a power supply line set to zero volt, and an emitter connected to the signal line 54. The fifth circuit $31_5$ has an input terminal $32_5$ connected to the signal line 54, and the first to fourth output terminals $33_{51}$–$33_{54}$ respectively connected to the signal lines $34_1$–$34_4$.

When the wired-OR circuit 44 is not selected, the level-converted signal output terminals $35_1$–$35_4$ are set to L, so that they are prevented from being maintained in the floating states.

A description will now be given of a level conversion circuit according to a second embodiment of the present invention. In the first embodiment of the present invention, the output signals b1-b4 are respectively inverted versions of the input signals B1-B4, as shown in Table 1. The second embodiment of the present invention, the output signals b1-b4 are in phase with the input signals B1-B4, respectively.

Figure 9:
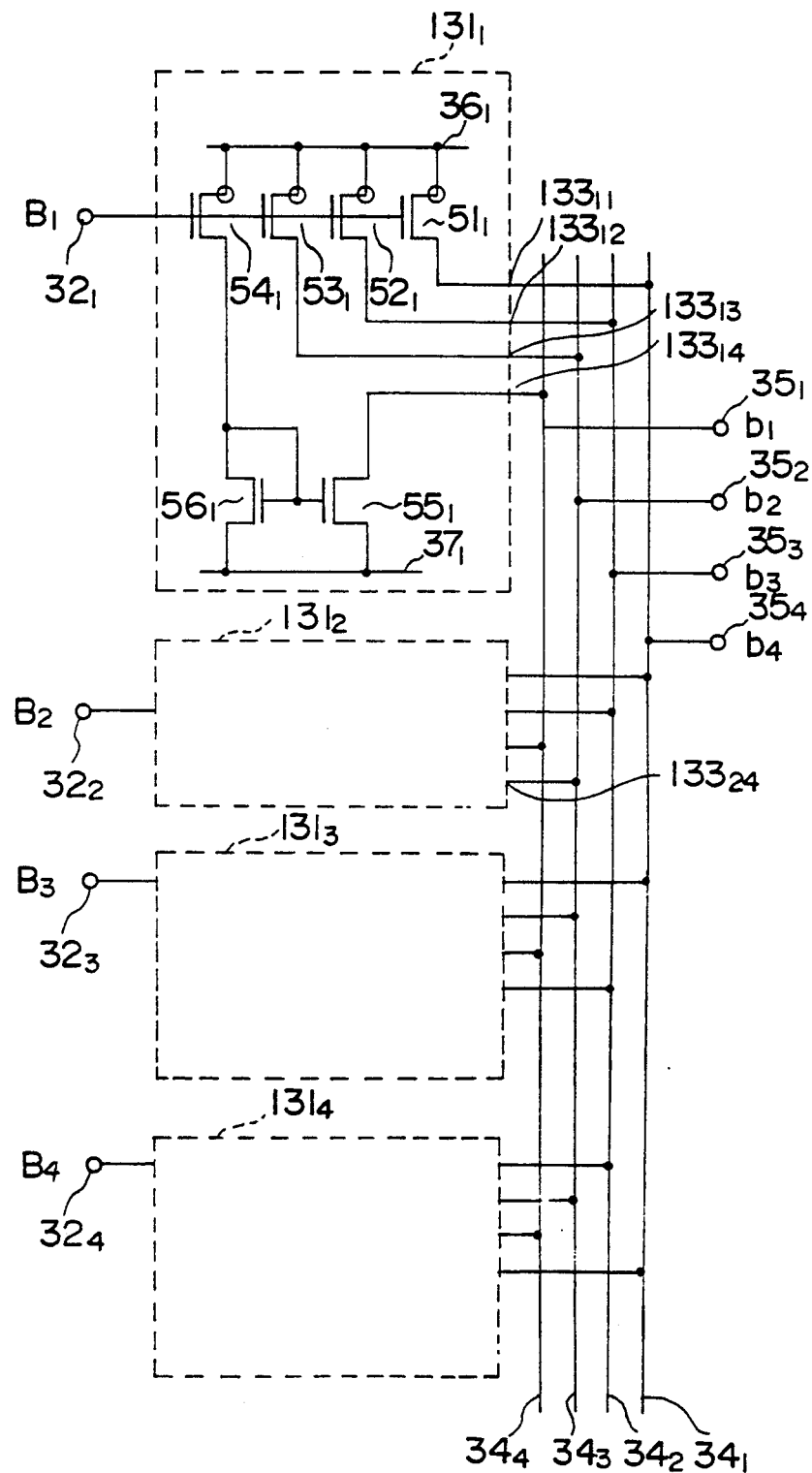
FIG.9 is a circuit diagram of a level conversion circuit according to a second embodiment of the present invention.

FIG. 9 is a circuit diagram of the level conversion circuit according to the second embodiment of the present invention. In FIG. 9, parts which are the same as those shown in the previous figures are given the same reference numerals as in the previous figures. The level conversion circuit shown in FIG. 9 has four circuits $131_1$–$131_4$ (n=4) respectively having identical circuit configurations. For example, the first circuit $131_1$ comprises four PMOS transistors $51_1$, $52_1$, $553_1$ and $54_4$, and two nMOS transistors $55_1$ and $56_1$. The sources of the pMOS transistors $51_1$–$54_1$ are connected to the power supply line $36_1$. The drains of the pMOS transistors $51_1$–$53_1$ are connected to the signal lines $34_1$–$34_3$, respectively. The gates of the pMOS transistors $51_1$–$54_1$ are connected to the input terminal $32_1$ to which the input signal B1 is applied. The gates of the nMOS transistors $55_1$ and $56_1$ are connected to each other, and the sources thereof are connected to the power supply line $37_1$. The drain and gate of the nMOS transistor $56_1$ are connected to each other and to the drain of the pMOS transistor $54_1$. The drain of the nMOS transistor $55_1$ is connected to the signal line $34_4$.

The fourth terminals $133_{14}$–$133_{44}$ of the first to fourth circuits $131_1$–$131_4$ are connected to the respective, different signals lines $34_1$–$34_4$. That is, the fourth terminals $133_{14}$, $133_{24}$, $133_{34}$ and $133_{44}$ of the first to fourth circuits $131_1$–$133_4$ are respectively connected to the signals lines $34_4$, $34_3$, $34_2$ and $34_1$.

Table 3 shows the operation of the logic conversion circuit shown in FIG. 9.

TABLE 3

| B1 | B2 | B3 | B4 | b1 | b2 | b3 | b4 |
|----|----|----|----|----|----|----|----|
| L | H | H | H | L | H | H | H |
| H | L | H | H | H | L | H | H |
| H | H | L | H | H | H | L | H |
| H | H | H | L | H | H | H | L |

H = −0.8 V   H = 0 V
L = −1.6 V   L = −5 V

Figure 10:
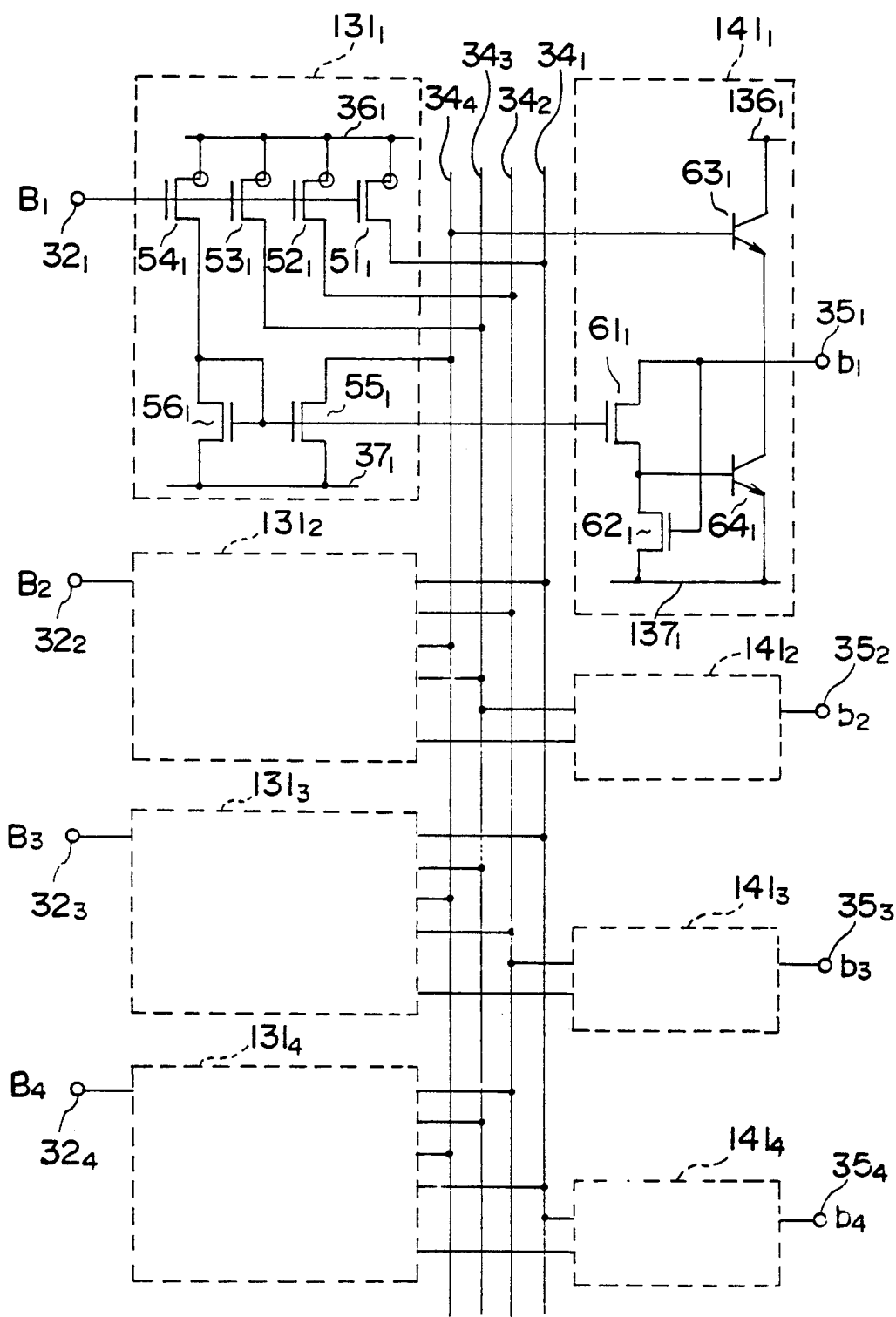
FIG.10 is a circuit diagram of a variation of the level conversion circuit shown in FIG.9.

FIG.10 is a variation of the circuit configuration shown in FIG.9. In FIG.10, parts which are the same as those shown in FIG.9 are given the same reference numerals. The variation shown in FIG.10 has four bipolar/MOS transistor circuits $141_1$–$141_4$ having identical circuit configurations. In FIG.10, the circuit configuration of only the bipolar/MOS transistor circuit $141_1$ is shown for the sake of simplicity. The bipolar/MOS transistor circuit $141_1$ has two nMOS transistors $61_1$ and $62_1$, and two NPN bipolar transistors $63_1$ and $64_1$. The base (first input terminal) of the bipolar transistor $63_1$ of the bipolar/MOS transistor circuit $141_1$ is connected to the signal line $34_4$. The gate (second input terminal) of the nMOS transistor $61_1$ is connected to the gates of the nMOS transistors $55_1$ and $56_1$. The collector of the bipolar transistor $63_1$ is connected to a power supply line $136_1$, which has a potential identical to or different from that of the power supply line $36_1$. The emitter of the bipolar transistor $63_1$ is connected to the output terminal $35_1$, the collector of the bipolar transistor $64_1$, the drain of the nMOS transistor $61_1$ and the gate of the nMOS transistor $62_1$. The base of the bipolar transistor $64_1$ is connected to the source of the nMOS transistor $61_1$ and the drain of the nMOS transistor $62_1$. The source of the nMOS transistor $62_1$ and the emitter of the bipolar transistor $64_1$ are connected to a power supply line set to a potential identical to or different from that of the power supply line $37_1$.

The first input terminals of the bipolar/MOS transistor circuits $141_1$–$141_4$ are connected to the signal lines $34_4$–$34_1$, respectively. The second input terminal of the bipolar/MOS transistor circuits $141_1$–$141_4$ are connected to the gates of the nMOS transistors of the first to fourth circuits $131_1$–$131_4$.

The bipolar/MOS transistor circuits $141_1$–$141_4$ increase a load driving ability greater than that for the circuit configuration shown in FIG.9. The level conversion circuit shown in FIG.10 operates as shown in Table 3.

Figure 1:
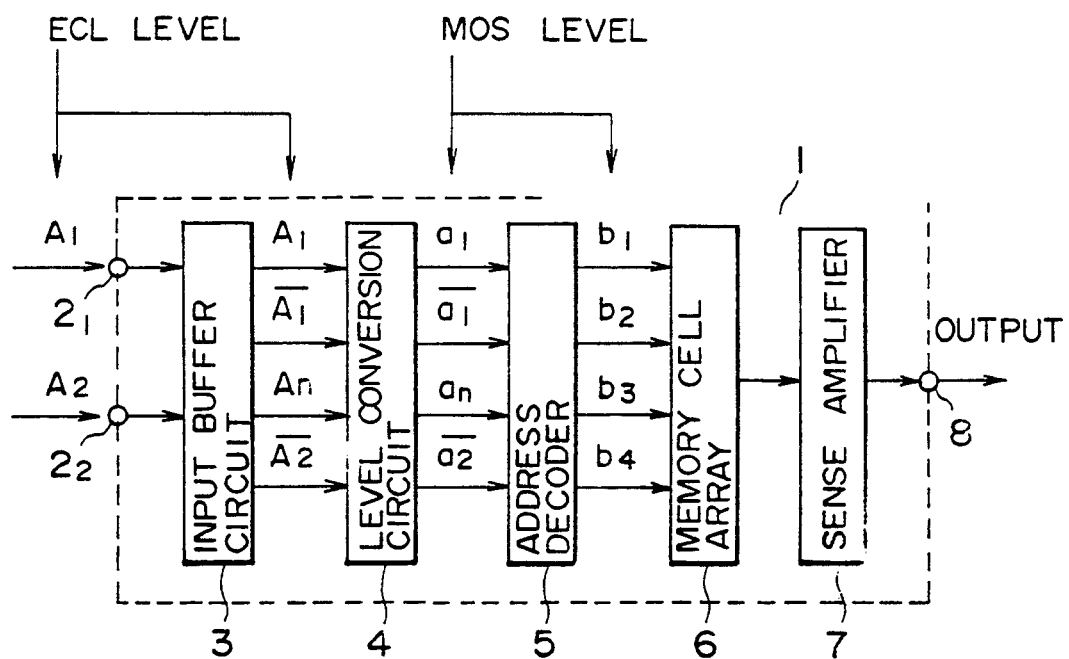
FIG.1 is a block diagram of a conventional RAM including Bi-MOS transistors.
Figure 2:
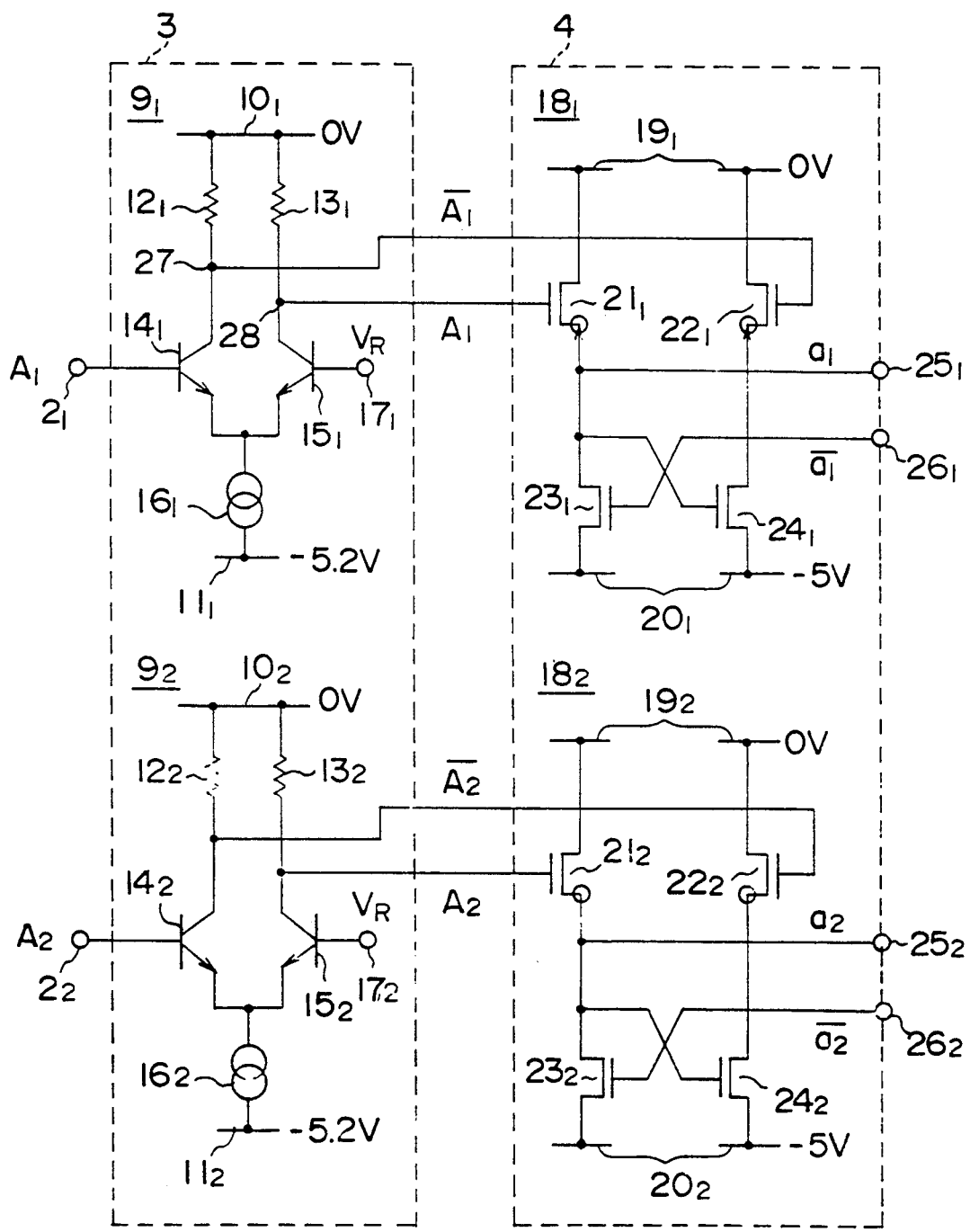
FIG.2 is a circuit diagram of an input buffer circuit and a level conversion circuit shown in FIG 1.
Figure 3:
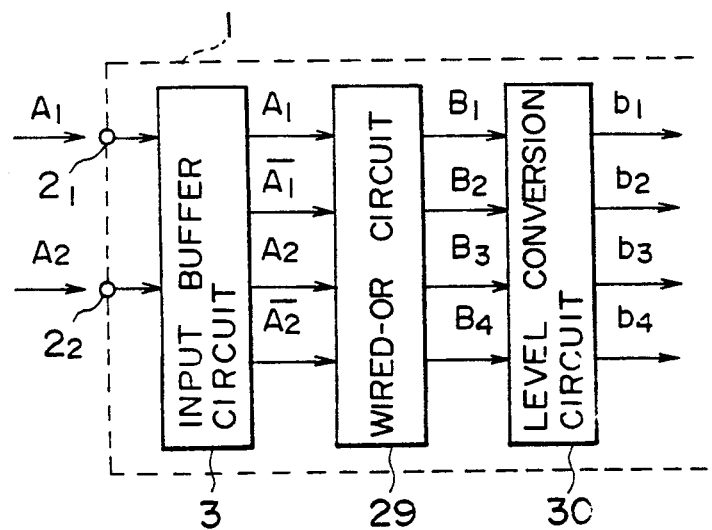
FIG.3 is a block diagram illustrating a disadvantage of the conventional level conversion circuit.

According to the present invention, the level conversion circuit does not need complementary input signals. Hence, a RAM having a structure as shown in FIG.3 can be configured. Further, the present invention can operate at a speed greater than that of the conventional level-conversion circuit. This is due to the fact that the level conversion circuit of the present invention also functions as the decoder. That is, the present invention does not need the address decoder as shown in FIG.1.

The bipolar/MOS transistor circuits shown in FIG.10 can be applied to the circuit configuration shown in FIG.6.

The present invention is not limited to the specifically disclosed embodiments, and variations and modifications may be made without departing from the scope of the present invention.

What is claimed is:

1. A level conversion circuit comprising:
    first to nth circuits, each having an input terminal for receiving a corresponding input signal and having first to nth output terminals, where n is an integer;
    a plurality of n signal lines coupled to each of said first to nth circuits;
    each of said first to nth circuits comprising:
        means for outputting a first voltage signal to the first output terminal thereof and for outputting a second voltage signal to said second to nth output terminals thereof when the input signal applied to the input terminal thereof is at a first level, and
        means for maintaining each of said first to nth output terminals thereof in a common high-impedance state when said input signal is at a second level, different from said first level;
    the first output terminal of each of said first both nth circuits being connected to a respectively corresponding one of the plurality of n signal lines and thereby defining a respectively associated set of (n=1) remaining signal lines of the plurality of n signal lines and the respective first output terminals of said first to nth circuits being connected to respectively corresponding and mutually different ones of the plurality of n signal lines; and
    the respective, second to nth output terminals, of each of said first to nth circuits, being connected to the respectively corresponding ones of the respectively associated sets of the (n=1) remaining signal lines.

2. A level conversion circuit as claimed in claim 1, wherein each of the first to nth circuits further comprises:
    first and second p-channel FETs, and first to nth n-channel FETs;
    the first p-channel FET has a source connected to a first power supply line, a drain connected to said first output terminal, and a gate connected to the input terminal;
    the second p-channel FET has a source connected to the first power supply line, a gate connected to the input terminal, and a drain;
    the first n-channel FET has a drain connected to the drain of the second p-channel FET, a source connected to a second power supply line, and a gate connected to the drain of the first n-channel FET; and
    the second to nth n-channel FETs respectively have drains connected to said remaining signal lines, gates connected to the gate of said first n-channel FET, and sources connected to the second power supply line.

3. A level conversion circuit as claimed in claim 2, wherein:
    each said first and second p-channel FETs comprises a p-channel MOS transistor; and
    each of said first to nth n-channel FETs comprises an n-channel MOS transistor.

4. A level conversion circuit as claimed in claim 1, wherein each of the first to nth circuits further comprises:
    first and second n-channel FETs, and first to nth p-channel FETs;
    said second to nth p-channel FETs respectively have sources connected to a first power supply line, drains corrected to said (n=1) remaining signal lines, and gates connected to said input terminal;
    said first p-channel FET has a source connected to said first power supply line, a gate connected to said input terminal, and a drain;
    said first n-channel FET has a drain connected to said first output terminal, a source connected to a second power supply line, and a gate; and
    said second n-channel FET has a drain connected to the drain of said first p-channel FET, a source connected to the second power supply line, and a gate connected to the drain of said second n-channel FET and connected to the gate of said first n-channel FET.

5. A level conversion circuit as claimed in claim 4, wherein:
    each of said first and second n-channel FETs comprises an n-channel MOS transistor; and
    each of said first to nth p-channel FETs comprises a p-channel MOS transistor.

6. A level conversion circuit as claimed in claim 1, wherein:
    said input signals respectively applied to input terminals of said first to nth circuits comprises Emitter-Coupled Logic level signals; and
    n output voltage signals respectively output onto said n signal lines comprise MOS-level signals.

7. A level conversion circuit as claimed in claim 1, wherein said level conversion circuit further comprises means for amplifying n output signals respectively output by said n signal lines.

8. A level conversion circuit as claimed in claim 4, wherein said level conversion circuit further comprises:
    first to nth bipolar/MOS transistor circuits;
    each of said first to nth bipolar/MOS transistor circuits has a first input terminal connected to said input terminal of a corresponding one of the first to nth circuits, a second input terminal connected to the gate of said first and second n-channel MOS transistors of said corresponding one of the first to nth circuits, and an output terminal.

9. A level conversion circuit as claimed in claim 8, wherein each of said first to nth bipolar/MOS transistor circuits further comprises:
    first and second bipolar transistors, and third and fourth n-channel MOS transistors;
    said first bipolar transistor has a base connected to said output terminal of said corresponding one of the first to nth circuits, a first terminal connected to a third power supply line, and a second terminal connected to said output terminal of one of the first to nth bipolar/MOS transistor circuits;
    said second bipolar transistor has a first terminal connected to the second terminal of said first bipolar transistor, an emitter connected to a fourth power supply line and a base;

said third n-channel MOS transistor has a drain connected to the first terminal of said second bipolar transistor, a source connected to the base of said second bipolar transistor, and a gate connected to the gates of said first and second n-channel MOS transistors of said corresponding one of said first to nth circuits; and said fourth n-channel MOS transistor has a drain connected to the source of said third n-channel MOS transistor, a source connected to said fourth power supply line, and a gate connected to the first terminal of said second bipolar transistors.

10. An address signal decoding system for supplying n address signals to a memory cell array of a memory device, said address signal decoding system comprising:

input buffer means for generating $\log_2 n$ pairs of complementary signals from $\log_2 n$ external address signals where n is an integer;

wired-OR circuit means, coupled to said input buffer means, for generating n address signals from said $\log_n 2n$ pairs of complementary signals; and level conversion circuit means, coupled to said wired-OR circuit means for generating n level-converted address signals from said n address signals and for supplying said n level-converted address signals to the memory cell array, wherein said level conversion circuit means comprises:

first to nth circuits, each having an input terminal for receiving a corresponding input signal and having first to nth output terminals;

a plurality of n signal lines coupled to each of said first to nth circuits and the memory cell array;

each of said first to nth circuits comprising:

means for outputting a first voltage signal to the first output terminal thereof and for outputting a second voltage signal to said second to nth output terminals thereof when one of said n address signals applied to the input terminal thereof is at a first level, and means for maintaining each of said first to nth output terminals thereof in a common high-impedance state when said one of n address signals is at a second level, different from said first level;

the first output terminal of each of said first to an circuits being connected to a respectively corresponding one of the plurality of n signal lines and thereby defining a respectively associated set of (n=1) remaining signal lines of the plurality of n signal lines and the respective first output terminals of said first to nth circuits being connected to respective corresponding and mutually different ones of the plurality of n signal lines; and the respective, second to nth output terminals, of each of said first to nth circuits, being connected to the respectively corresponding ones of the respectively associated sets of the (n−1) remaining signal lines.

11. An address signal decoding system as claimed in claim 10, wherein each of the first to nth circuits further comprises:

first and second p-channel FETs, and first to nth n-channel FETs;

the first p-channel FET has a source connected to a first power supply line, a drain connected to said first output terminal, and a gate connected to the input terminal;

the second p-channel FET has a source connected to the first power supply line, a gate connected to the input terminal, and a drain;

the first n-channel FET has a drain connected to the drain of the second p-channel FET, a source connected to a second power supply line, and a gate connected to the drain of the first n-channel FET; and the second to nth n-channel FETs respectively have drains connected to said (n−1) remaining signal lines, gates connected to the gate of said first n-channel FET, and sources connected to the second power supply line.

12. The address signal decoding system as claimed in claim 10, wherein each of the first to nth circuits further comprises:

first and second n-channel FETs, and first to nth p-channel FETs;

said second to nth p-channel FETs respectively have sources connected to a first power supply line, drains corrected to said (n−1) remaining signal lines, and gates connected to said input terminal;

said first p-channel FET has a source connected to said first power supply line, a gate connected to said input terminal, and a drain;

said first n-channel FET has a drain connected to said first output terminal, a source connected to a second power supply line, and a gate; and said second n-channel FET has a drain connected to the drain of said first p-channel FET, a source connected to the second power supply line, and a gate connected to the drain of said second n-channel FET and the gate of said first n-channel FET.

13. The address signal decoding system as claimed in claim 10, wherein said n address signals comprise Emitter-Coupled Logic level signals; and said level-converted address signals comprises MOS-level signals.

14. The address signals decoding system as claimed in claim 10, wherein:

said wired-on circuit means comprises a select signal input terminal to whcih a select signal is externally applied; and said address signal decoding system comprises means for preventing said first to nth signal lines from being maintained in a floating state when said select signal is not applied to said select signal input terminal of said wired-OR circuit means.

* * * * *

UNITED STATES PATENT AND TRADEMARK OFFICE
CERTIFICATE OF CORRECTION

PATENT NO. : 5,223,752
DATED : Jun. 29, 1993
INVENTOR(S) : Yasuhiro ISHII

It is certified that error appears in the above-indentified patent and that said Letters Patent is hereby corrected as shown below:

Col. 10, claim 8, line 46, change "circuits;" to --circuits:--

Signed and Sealed this

Twelfth Day of April, 1994

Attest:

BRUCE LEHMAN

*Attesting Officer*

*Commissioner of Patents and Trademarks*